United States Patent [19]

Gonzalez

[11] Patent Number: 4,727,912

[45] Date of Patent: Mar. 1, 1988

[54] LEAD STRAIGHTENER AND FLATTENER FOR SEMICONDUCTOR DEVICES

[75] Inventor: Victor M. Gonzalez, Chandler, Ariz.

[73] Assignee: Motorola Inc., Schaumburg, Ill.

[21] Appl. No.: 931,309

[22] Filed: Nov. 17, 1986

[51] Int. Cl.$^4$ ............................................. B21F 1/02
[52] U.S. Cl. .................................................... 140/147
[58] Field of Search .......................................... 140/147

[56] References Cited

U.S. PATENT DOCUMENTS

| | | | |
|---|---|---|---|
| 3,028,886 | 4/1962 | Drukker | 140/147 |
| 3,106,945 | 10/1963 | Wright et al. | 140/147 |
| 3,344,816 | 10/1967 | Zemek | 140/147 |

FOREIGN PATENT DOCUMENTS 738724  6/1980  U.S.S.R. ............................. 140/147

Primary Examiner—Lowell A. Larson
Attorney, Agent, or Firm—Harry A. Wolin

[57] ABSTRACT

A lead straightener and flatner for semiconductor devices having a female die and a male die with a plurality of triangular shaped teeth beveled at their ends to allow easy penetration between the leads of a semiconductor device. The triangular configuration allows the leads to be straightened laterally and longitudinally before they are flattened horizontally. Small deformations cause indentations to be made in the leads without perturbing their general shape so that the spring energy of the leads is reduced.

10 Claims, 5 Drawing Figures

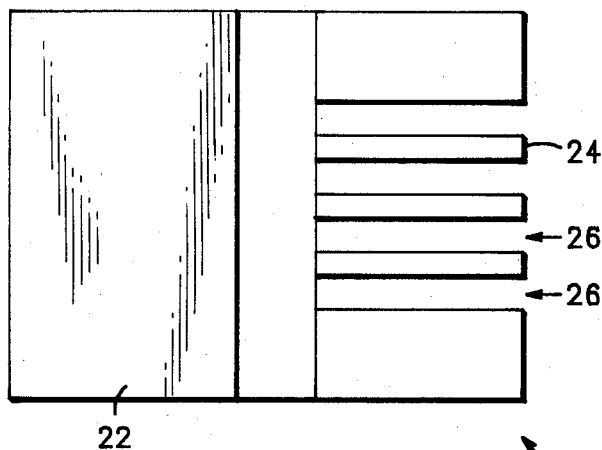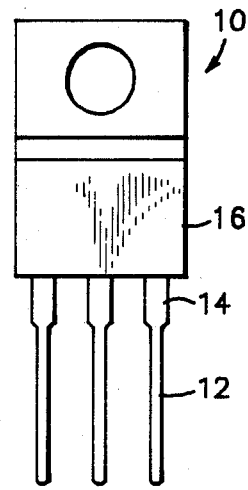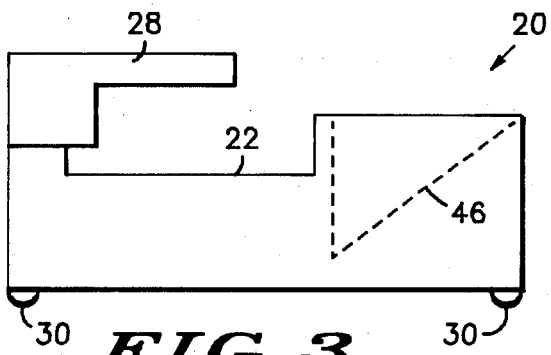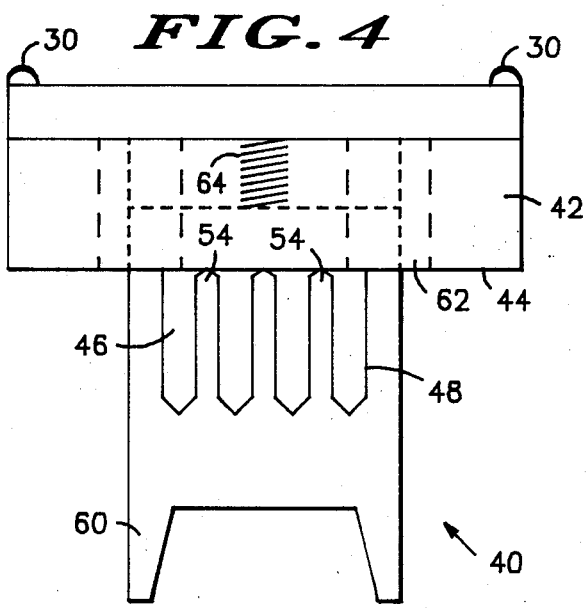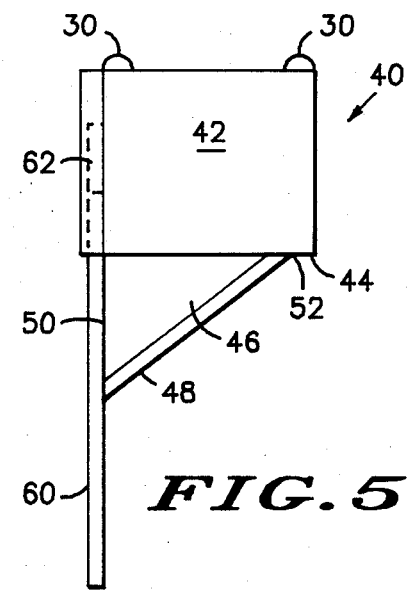

LEAD STRAIGHTENER AND FLATTENER FOR SEMICONDUCTOR DEVICES

BACKGROUND OF THE INVENTION

This invention generally pertains to a lead straightener and flattener for semiconductor devices. Generally, in the production of semiconductor devices it is desirable to have the leads of the semiconductor device straight and parallel to each other. Conventional lead straighteners and flatteners tend to have problems in reducing the spring energy of the leads. Additionally, if the leads of the semiconductor device are extremely bent when introduced to the lead straightener, there is a tendency to shear off the leads. Therefore, in order to obtain higher yields in semiconductor device manufacturing, a lead straightener and flattener capable of reducing the spring energy of the leads and additionally able to straighten leads which are extremely bent is desired for semiconductor device production.

SUMMARY OF THE INVENTION

The present invention pertains to a lead straightener and flattener for use in straightening and flattening the leads of semiconductor devices. In the present invention, a semiconductor device is placed and secured on a female die which includes means for support of both the body and the leads of the semiconductor device. Next, a male die which includes a plurality of teeth is introduced to the female die containing the semiconductor device. These teeth are beveled at their lower ends to allow easy penetration between the leads of the semiconductor device. Additionally, the teeth are longer at a first end than at a second end. This allows a combing process to occur beginning near the body of the semiconductor device and continuing outward to the ends of the leads. Once the combing process has taken place and the leads have been straightened both laterally and longitudinally, small deformations angularly disposed between the teeth and a top plate of the male die to which the teeth are mounted make indentations in the leads of the semiconductor device thereby reducing the spring energy of the leads while not perturbing their general shape.

It is an object of the present invention to provide a lead straightener and flattener for semiconductor devices which can be used in automated production.

It is a further object of the present invention to providea lead straightener and flattener for semiconductor devices which easily penetrates between the leads of the semiconductor device.

It is a further object of the present invention to provide a new and improved lead straightener and flattener for semiconductor devices which allows a combing process which straightens the leads laterally and longitudinally prior to straightening them horizontally.

It is a further object of the present invention to provide a new and improved lead straightener and flattener for semiconductor devices which effectively reduces the spring energy of the leads without pertrubing their general shape.

These and other objects of this invention will become apparent to those skilled in the art upon consideration of the accompanying specification, claims and drawings.

BRIEF DESCRIPTION OF THE DRAWINGS

Referring to the drawings, wherein like characters indicate like parts throughout the figures:

FIG. 1 is an enlarged top view of a semiconductor device on which the present invention is typically used;

FIG. 2 is a top view of a female die embodying the present invention;

FIG. 3 is a side view of the female die of FIG. 2;

FIG. 4 is a front view of a male die embodying the present invention; and

FIG. 5 is a side view of the male die of FIG. 4.

DESCRIPTION OF THE PREFERRED EMBODIMENTS

Referring specifically to FIG. 1, an enlarged top view of a semiconductor device, designated 10, is shown. Semiconductor device 10 is typical of the device on which the present invention will be used. Semiconductor device 10 includes a plurality of leads, 12, each member of plurality of leads 12 having a shoulder, 14. Shoulder 14 is thicker and stronger than the remainder of lead 12 and is also closer to the plastic encapsulated body, 16. Because of this, it is very unlikely that lead 12 will bend at shoulder 14. Therefore, the present invention is mainly concerned with straightening and flattening the areas of lead 12 which do not include shoulder 14.

Referring specifically to FIG. 2 and FIG. 3, top and side views respectively of a female die, 20, embodying features of the present invention are shown. Female die 20 includes a body support 22 which serves to support body 16 of semiconductor device 10. Female die 20 also includes extensions, 24, which serve to support leads 12 of semiconductor device 10. In between extensions 24 are a plurality of openings, 26 which will be discussed presently. Female die 20 further includes a clamp, 28, which serves to secure semiconductor device 10 in place during the lead's straightening and flattening process. Also included on female die 20 are fastening holes, 30. Fastening holes 30 are used to mount female die 20 on a hydraulic press or the like and enable it to be used in automated production. It should be understood that the present invention may be used manually or in any type of automated process.

Referring specifically to FIG. 4 and FIG. 5, front and side views respectively of a male die, 40, embodying further features of the present invention are shown. Male die 40 includes a top plate 42, having a bottom face, 44 wherefrom a plurality of teeth, 46, extend. Teeth 46 are longer at a first end, 50, than at a second end, 52, giving teeth 46 a triangular configuration which decreases uniformly from first end 50 to second end 52. A lead locator, 60, is disposed adjacent first end 50 of teeth 46. Lead locator 60 is retained in position by guides, 62, which are located adjacent top plate 42. Lead locator 60 extends from guides 62 below teeth 46 and is movable upon compression of a spring, 64. Teeth 46 are beveled at lower ends, 48, thereby allowing easier penetration between leads 12 of semiconductor device 10. Angularly extending between teeth 46 and bottom face 44 of top plate 42 are deformations, 54, which will be explained presently. Additionally, male die 40 also includes fastening holes 30 for the same reasons as female die 20.

Referring back to FIGS. 1-5, semiconductor device 10 is placed onto female die 20 and clamp 28 securely holds semiconductor device 10 in place. Leads 12 of semiconductor device 10 are aligned so that shoulders 14 are directly over extensions 24. Once semiconductor device 10 is positioned on female die 20, male die 40 begins to engage female die 20. Lead locator 60 engages leads 12 and insures that they are properly positioned. As maledie 40 continues to engage female die 20, pressure upon lead locator 60 causes spring 64 to compress allowing lead locator 60 to move further allowing penetration of teeth 46 between leads 12. First end 50 of teeth 46 is the first portion of teeth 46 to penetrate. Penetration begins between leads 12 just below shoulders 14. As teeth 46 continue to penetrate the triangular configuration of teeth 46 initiates a combing action upon leads 12 thereby straightening them laterally and longitudinally. The triangular configuration of teeth 46 further reduces the possibility of shearing leads 12 because the whole tooth does not penetrate at one time. Teeth 46 penetrate into openings 26 of female die 20 thereby allowing bottom face 44 of top plate 42 to come in contact with leads 12. A dotted line view of teeth 46 at this point in relation to female die 20 is shown in FIG. 3. However, prior to this contact deformations 54 which are angularly extended between teeth 46 and bottom face 44 of top plate 42 come in contact with leads 12 and make a small indentation as male die 40 is forced downward. This indentation caused by deformation 54 greatly reduces the spring energy of leads 12. Additionally, bottom face 44 of top plate 42 coming in contact with leads 12 helps to flatten leads 12.

Thus, it is apparent that has been provided, in accordance with the invention, an improved lead straightener and flattener for semiconductor devices which meets the objects and advantages set forth above. While we have shown and described the specific embodiments of this invention, further modifications and improvements will occur to those skilled in the art. We desire it to be understood, therefore, that this invention is not limited to the particular form shown and we intend in the appended claims to cover all modifications which do not depart from the spirit and scope of this invention.

What is claimed is:

1. A lead straightener and flattener for semiconductor devices comprising:
    a female die including means for supporting the body of a semiconductor device, means for supporting the leads of said semiconductor device having openings therebetween and means for holding said semiconductor device stationary so that said leads and said body are supported; and
    a male die having a top plate, a plurality of teeth connected to and extending from said top plate, said teeth including means for penetration between said leads of said semiconductor device and into said openings of said female die, said male die further including lead locating means movably mounted thereon.

2. The device of claim 1 further comprising mounting means on the male die and the female die.

3. The device of claim 1 wherein means for penetration includes the teeth being beveled at their lower ends.

4. The device of claim 1 wherein the teeth are longer at a first end than at a second end and the length of said teeth uniformly decreases from said first end to said second end.

5. The device of claim 1 further comprising means for reducing spring energy of the leads.

6. The device of claim 5 wherein means for reducing includes deformations, said deformations being disposed between the first ends of the plurality of teeth and angularly extending between said teeth and the top plate.

7. A lead straightener and flattener for semiconductor devices comprising:
    a female die including means for supporting the body of a semiconductor device, means for supporting the leads of said semiconductor device having openings therebetween and an overlapping catch for holding said semiconductor device stationary so that said leads and said body are supported;
    a male die including a top plate, a plurality of teeth connected to and extending from said top plate, said teeth being beveled at their lower ends for penetration between said leads of said semiconductor device and into said openings of said female die, said teeth further being longer at a first end than at a second end and the length of said teeth uniformly decreasing from said first end to said second end, a movable lead locator extending beyond said teeth, said male die further having deformations disposed between said first ends of said teeth angularly extending between said teeth and said top plate; and
    means for mounting said male die and said female die.

8. A method for straightening and flattening the leads of a semiconductor device comprising the steps of:
    providing a female die of a lead straightener and flattener including means for supporting said body, means for supporting said leads having openings therebetween and means for securing said semiconductor device;
    placing said semiconductor device on said female die and securing it to said female die;
    providing a male die of said lead straightener and flattener including a top plate, a plurality of teeth connected to and extending from said top plate, said teeth including means for penetration between said leads of said semiconductor device, said male die further including lead locating means movably mounted thereon; and
    applying said male die to said female die containing said semiconductor device so that said teeth penetrate between said leads straightening them laterally and longitudinally, said teeth further penetrating into said openings of said female die allowing said top plate to encounter said leads and flatten them.

9. The method of claim 8 wherein the providing a male die step includes providing means for reducing spring energy of the leads.

10. The method claim 9 wherein the applying said male die step includes making indentations in the leads of the semiconductor device.

* * * * *